United States Patent
Yan

(10) Patent No.: US 9,812,279 B2
(45) Date of Patent: Nov. 7, 2017

(54) ELECTRODE MATERIAL WITH LOW WORK FUNCTION AND HIGH CHEMICAL STABILITY

(71) Applicant: TongYuan textile limited, Suzhou (CN)

(72) Inventor: Jian Xin Yan, Su Zhou (CN)

( * ) Notice: Subject to any disclaimer, the term of this patent is extended or adjusted under 35 U.S.C. 154(b) by 0 days.

(21) Appl. No.: 14/386,884

(22) PCT Filed: Dec. 31, 2012

(86) PCT No.: PCT/CN2012/087966
§ 371 (c)(1),
(2) Date: Sep. 22, 2014

(87) PCT Pub. No.: WO2013/152613
PCT Pub. Date: Oct. 17, 2013

(65) Prior Publication Data
US 2015/0054398 A1    Feb. 26, 2015

(30) Foreign Application Priority Data
Apr. 13, 2012   (CN) .......................... 2012 1 0107766

(51) Int. Cl.
| | |
|---|---|
| *H01J 1/304* | (2006.01) |
| *H01J 37/06* | (2006.01) |
| *C23C 16/40* | (2006.01) |
| *H01J 1/14* | (2006.01) |
| *H01J 9/02* | (2006.01) |

(52) U.S. Cl.
CPC .............. *H01J 1/304* (2013.01); *C23C 16/40* (2013.01); *H01J 1/14* (2013.01); *H01J 9/025* (2013.01); *H01J 37/06* (2013.01); *H01J 2201/30446* (2013.01); *H01J 2237/06316* (2013.01); *Y10T 428/2916* (2015.01)

(58) Field of Classification Search
CPC .... H01J 1/304; H01J 9/025; H01J 1/14; H01J 37/06; H01J 2237/06316; H01J 2201/30446; C23C 16/40; Y10T 428/2916
See application file for complete search history.

(56) References Cited

U.S. PATENT DOCUMENTS

| | | | |
|---|---|---|---|
| 6,190,579 B1 * | 2/2001 | Billings ................. | B82Y 10/00 252/515 |
| 6,680,562 B1 | 1/2004 | McGinn et al. | |
| 2003/0127593 A1 | 7/2003 | Shinada et al. | |
| 2008/0174225 A1 * | 7/2008 | Tessner ................. | H01J 1/3044 313/362.1 |

FOREIGN PATENT DOCUMENTS

CN         102629538 A      8/2012

\* cited by examiner

*Primary Examiner* — Donald Raleigh
*Assistant Examiner* — Kevin Quarterman

(57) ABSTRACT

The present invention discloses an electrode material that eases electron injection and does not react with contact substances. The structure of the material includes a conductive substrate plane on the top of which an emissive material is coated. The emissive coating bonds strongly with the substrate plane. The emissive material is of low work function and high chemical stability.

Figure 1:
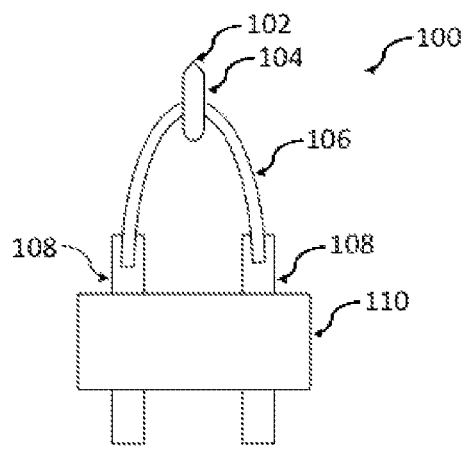

20 Claims, 5 Drawing Sheets

ELECTRODE MATERIAL WITH LOW WORK FUNCTION AND HIGH CHEMICAL STABILITY

TECHNICAL FIELD OF THE INVENTION

The present invention is related to the field of electrode material.

BACKGROUND OF THE INVENTION

Instruments that utilize focused electron beam include imaging instruments, such as scanning electron microscope (SEM) and transmission electron microscope (TEM); manufacturing instruments such as electron beam lithography machine (EBL) and chemical analysis instruments such as energy dispersive x-ray spectrometer, electron energy loss spectrometer (EELS), and auger electron spectrometer. The expectation for these instruments to achieve a higher performance requires an electron source that is capable of providing brighter electron beam with narrower energy spread. The brightness expectation is for achieving a higher signal-noise ratio for analytical instruments and high throughput for lithography machines; The narrower energy spread expectation is for better focusing power with the electromagnetic lens, since a finite chromatic aberration is inevitable in the current level of lens manufacturing. The brightness and energy spread of the electron source depend on both the electron source material and how the electron beam is generated.

In order to have electrons liberated from the electron source surface, which is termed as an emitter, one needs to provide the bound electrons with enough energy to overcome the energy barrier between the emitter surface and vacuum. The height of this energy barrier is defined as the emitter material work function. If thermal heating is used to excite the bound electrons to overcome this barrier, the emission mode is termed as thermionic emission and the electron source is termed as thermionic emitter. When the work function of the emitter material is lower, it requires lower temperature for the same degree of thermal excitation, which results in both an increase in emission brightness and a reduction in energy spread. Typical low work function thermionic emission materials include borides, carbides and oxides of elements belonging to the group 2, 3 and 4 in the periodic table. When heated to the same temperature, these low work function materials emit higher current density of electrons compared to the conventional thermionic emitter material W, which has a high work function. When one applies a negative electric potential on the emitter with respect to a neighboring electrode, the energy barrier height is reduced with increasing electric field strength, due to the schottky effect. This lowering of the barrier height helps electrons to escape the emitter surface with greater ease when thermal heating is still present for electron excitation. This emission mode is termed as schottky emission or field-assisted thermionic emission and the emitter is termed as schottky emitter. With an emitter material of ZrO/W (with work function of ~2.6 eV), schottky emitter produces higher brightness and lower energy spread than thermionic emitters. Yet when one keeps increasing the applied field strength, the energy barrier becomes so thin that the bound electrons can directly tunnel through the barrier into vacuum even without any thermal excitation. This emission mode is termed as field emission and the emitter is termed as field emitter. The relaxation from the requirement for high temperature (>1800K) thermal heating enables the field emission mode with the highest brightness and lowest energy spread among the three modes of electron emission. With the same electric field strength, it follows that the lower work function of the emitter material, the thinner the energy barrier becomes, therefore greater ease of electron tunneling. This results in a higher brightness and lower energy spread for field emitter with a lower work function than that with a higher work function.

Another important aspect for a practical electron emitter is that it should be able to emit electrons with current density unchanged over long period of time. A fluctuating or decaying/growing current adds complexity to the application instrument design and use. One key factor that causes emission current change is the adsorption of residue gas molecules left in the imperfect vacuum by the field emitter. The adsorbed molecules change surface work function and therefore change emission current density. For a thermionic emitter, the adsorption effect is less of an issue as compared to the low temperature field emitter. This is because the high temperature adopted in the thermionic emission process thermally desorbs any adsorbates from the surface and therefore maintains the same surface work function. For a low temperature field emitter, since there is no mechanism to drive off these adsorbates, an emission current fluctuation and decay over time is the consequent outcome. To lessen the influence from adsorbates, it is intuitively to create better vacuum where the residue gas is less. However, the requirement for higher vacuum adds up instrument cost and is also in sacrifice of operation convenience.

The currently commercialized field emitter is W with a high work function (4.5 eV). The high work function limits the highest achievable brightness with a tolerable energy spread for use in a focused electron beam instrument. On top of that, the W emitter is also known to be reactive to residue gas (presumably hydrogen) in vacuum. Its pre-decay plateau period is usually below 30 minutes in a vacuum not better than 1E-10 torr and below 5 hours in a vacuum not better than 1E-12 torr. In comparison, a schottky emitter usually emits electrons without decay in a vacuum not better than 1E-9 torr. The shorter stable period and higher vacuum requirement have made low temperature field emitter unpopular though it provides a higher brightness and narrower energy spread as compared to the schottky emitter. It is therefore highly desirable to engineer a low temperature field emitter material with low work function and high surface inertness to work stably for longer period of time under poorer vacuum condition.

It is generally believed that oxides are more chemically inert than metals of its composing element. However, oxides alone cannot be used as low temperature field electron emitters, because their conductivity is too low for electric current transportation. The structure of a thin film of low work function oxide over a conducting substrate can transport electrons sufficiently well to support low temperature field emission from the oxide surface. The requirement to make a stable structure is that the oxide layer has to be strongly bonded to the conductive substrate to endure the high electrostatic force generated by the extraction voltage during field emission process. The vibration or breaking off of the oxide layer will introduce field emission current fluctuation and decay. Usually, for a specific substrate material, there is only one specific crystal plane (or several planes) that it forms strong bonds with a certain oxide material. Therefore, the substrate needle has to be made in the form of a single crystal oriented along that specific crystal direction so that it has a tip top surface strongly bound with a layer of oxide film. Structure like this also benefits from a collimated beam shape, because the emission site is localized to that specific crystal plane, due to the fact that only that plane has a lowered work function. In the prior art, it has been found that the oxide of Zr preferably bound to the (100) surface of W and therefore, selectively reduce the work function of W (100) plane. When a sharp W needle terminated with (100) plane is used for the substrate onto which the ZrO is deposited, a field emitter with a low work function (2.6 eV) can be produced. (U.S. Pat. No. 3,374,386) It is generally believed that the reason for ZrO to form a stable thin film with (100) surface of W is related to lattice size matching between Zr atoms and W (100) plane lattice structure. Further findings suggested that W oxide can also form films over W (110) planes and (112) planes, which help W atoms to build up onto the tip apex oriented in the <100> or <111> direction when the tip is heated to a temperature to ensure high mobility of W atoms. The build-up tip is more inert than the original W tip without build up process. (U.S. Pat. Nos. 3,817,592, 7,888,654 B2) In these two cases, W oxide is not used to lower surface work function of the tip apex plane. Alkali-earth oxides, rare-earth oxides, thorium oxides, hafnium oxides are all known to be stable and has lower work function than ZrO and W oxide. In the best known prior art, no substrate material forms stable bonding with these oxides so that one can make a field emitter with reduced work function and increased surface inertness with those oxides.

As for making tip geometry with a raised apex, besides the above mentioned build-up process, another prior art (U.S. Pat. No. 7,431,856 B2) teaches that gas etchant preferably etches shank region over apex region of a tip under the application of an electric field. The described raised apex formation method only depends on the shape of the tip, not on the crystallinity nature or crystal orientation of the tip material.

SUMMARY OF INVENTION

It is the object of this invention to disclose an electrode material with both low work function and high chemical stability, which is composed of a conductive compound substrate as an emissive block and an oxide film formed on the surface of the emissive block as an emissive layer.

The disclosed compound substrate could be of many shapes, including flat plane, needle, cylinder or block. The compound substrate is with a certain crystallographic plane which bonds tightly with oxide film.

According to this invention, the said compound substrate material is boride, carbide or nitride of elements selected individually from or are a combination of Ca, Sr, Ba, Sc, Y, Lanthanides, Th, Ti, Zr, and Hf.

Preferably, the disclosed metal boride is a single crystal of hexaboride of Ca, Sr, Ba, Sc, Y, and Lanthanides, oriented in the lattice direction of <100>, <110>, or <111>.

It is further preferred that the disclosed metal carbide is a single crystalline monocarbide of Th, Ti, Zr, and Hf, oriented in the lattice direction of <100>, <110>, or <111>.

According to this invention, the described oxide film is metal oxide composed of, aside from oxygen, elements selected individually from or are a combination of Ca, Sr, Ba, Sc, Y, Lanthanides, Th, Ti, Zr, and Hf.

Further preferably, the disclosed compound substrate shares the same metal elements with the oxide film. The oxide film component elements other than oxygen can be directly supplied from the emissive block itself, therefore requires no additional evaporation source or reservoir structure.

Preferably, especially when the electrode material disclosed in this invention is used as electron source for electron beam instrument, the emissive block is preferred to be in the form of a needle and the apex of the needle is coated with the oxide film.

It is further preferred that the apex of the needle-shaped emissive block is a top flat platform perpendicular to the needle axis and the oxide film covers at least the top flat platform. The tip of the needle-shaped emissive block should be with a size small enough to induce the strong electric field necessary for field emission mechanism. And the needle axis should be parallel to a certain lattice direction, perpendicular to which the lattice plane binds strongly with the oxide film. The top flat platform is terminated with this lattice plane.

Further preferably, the emissive block needle apex is in the form of a top cylinder which axis is parallel or overlapping with the emissive block axis and the top flat platform perpendicular to the needle axis is the top surface of the top cylinder. The disclosed oxide film covers at least the top flat platform region. The existence of this top cylinder structure helps to concentrate electron emission to the top flat platform region and reduce substance in its neighboring region to build up towards the top flat platform, so as to further increase electron emission stability.

It is another objective of this invention to provide a vacuum field induced electron emitter structure which is composed of an insulator block; two electrode posts running through the insulator block; a filament welded onto the ends of the two electrode posts; a base needle welded in the middle portion of the filament and the base needle forms a tip at its apex; an emissive block attached onto the base needle tip, but still separated from the base needle with a binder layer and the emissive block is with a cylindrical region, a tapering region formed by contracting the top edge of the cylindrical region towards emissive block axis, a top flat platform perpendicular to the emissive block axis formed on the apex of the tapering region and the emissive block is a compound substrate; an electron emissive layer which is formed on the emissive block apex top flat platform and the emissive layer is oxide film.

Preferably, the emissive block material is boride, carbide or nitride of elements selected individually from or are a combination of Ca, Sr, Ba, Sc, Y, Lanthanides, Th, Ti, Zr, and Hf.

Preferably, the oxide film is metal oxide composed of, aside from oxygen, metal elements selected individually from or are a combination of Ca, Sr, Ba, Sc, Y, Lanthanides, Th, Ti, Zr, and Hf.

Preferably, the base needle is made of conductive material with high melting point and the conductive high melting point material is selected from C, W, Re, Ta or Mo.

Preferably, the binder layer is composed of C, Pt or W.

Preferably, the emissive block tapering region has a top cylinder on it and the axis of the top cylinder is parallel or overlapping with the emissive block axis and the top surface of the top cylinder is the top flat platform perpendicular to the emissive block.

It is the third objective of this invention to provide a method for producing top cylinder on the apex of the emissive block in the shape of needle or cylinder which is made of metal hexaboride. The procedures are as follows:

a. In vacuum, form a hemispherical tip cap of the emissive block with the hemisphere apex as (100) lattice plane;

b. Apply a positive bias to the emissive block with respect to a neighboring electrode under a gas pressure of etchant gas;

c. During the hemisphere surface being etched by the etchant gas, the etching rate of the apical (100) lattice plane is slower than that of other lattice planes; When a top cylinder is formed perpendicular to the emissive block axis on the hemisphere surface because of the etching rate difference, stop the applied electric bias and remove the etchant gas and the said top cylinder is formed.

Preferably, the above described etchant gas is oxygen, nitrogen or water.

It is the fourth objective of this invention to provide a vacuum electron field emitter structure which is composed of an insulator block; two electrode posts running through the insulator block; two filaments welded individually onto the ends of the two electrode posts; two graphite heater pads welded between the two filaments; a block substrate sandwiched between the two graphite heater pads and the center of the block substrate protrudes outwards to form an emissive tip; A flat platform perpendicular to the emissive block axis formed on the apex of the emissive tip; The emissive block is a compound substrate; an electron emissive layer formed on the emissive tip apex top flat platform; The emissive layer is oxide film.

Preferably, the block substrate and emissive tip is boride, carbide or nitride of elements selected individually from or are a combination of Ca, Sr, Ba, Sc, Y, Lanthanides, Th, Ti, Zr, and Hf.

Preferably, the oxide film is metal oxide composed of, aside from oxygen, metal elements selected individually from or are a combination of Ca, Sr, Ba, Sc, Y, Lanthanides, Th, Ti, Zr, and Hf.

It is the fifth objective of this invention to provide a method for producing oxide film onto the flat platform of the emissive block which is in shapes of needle or cylinder and the procedures are as follows:

a. Forming oxide substance on the neighboring surface of the flat platform;

b. Applying an electric potential on the emitter with respect to a neighboring electrode to diffuse the oxide substance onto the flat platform in vacuum;

c. Stopping the applied potential when the oxide film completely covers the flat platform and the formation of oxide film on top of emissive block flat platform is completed.

Preferably, the step a is by heating the emissive block in an oxygen-containing gas.

Preferably, the step a is by depositing oxide substance onto flat platform neighboring surface in ways of thin film deposition techniques.

Preferably, the step b is accompanied by heating to a temperature at which the mobility of the oxide substance increases and the heating is stopped when step b is completed.

Preferably, the above procedures include step d after the completion of step c: heating the emissive block to a temperature lower than the oxide film vaporization point to realize strong bonding between the oxide film and the flat platform.

Preferably, the step d is carried as follows: keeping the emissive block in a certain oxygen-containing gas pressure for a certain time to achieve strong bonding between the oxide film and the flat platform, with or without heating.

The electrode material disclosed in this invention could be used as an electron source to supply electrons and emits electrons in ways of field emission during operation.

In order to improve stability during electron emission for the above described electrode material, the electrode material is operated accompanied by heating and the heating temperature is lower than the point where said electrode material is able to emit electrons through thermionic emission.

The electrode material disclosed in this invention is used as vacuum electron source for electron beam instruments, electron injection electrode for organic or inorganic light emitting diode, and cathode for organic or inorganic solar cell, organic or inorganic transistor and electrochemical apparatus.

The described electron beam instruments include: scanning electron microscope, transmission electron microscope, scanning transmission electron microscope, electron beam lithography machine, energy dispersive x-ray spectrometer, electron energy loss spectrometer and so on.

This invention has the following advantages compared to existing technology:

The electrode material disclosed in this invention is with a lower work function during electron emission, and the oxide film layer binds stronger with the emissive block and is chemically more stable. The vacuum field induced electron emitter disclosed in this invention realizes long time high current density and non-changing current density electron emission.

DESCRIPTION WITH DRAWINGS

Figure 2:
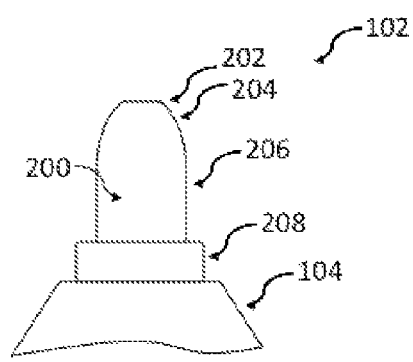
Figure 3:
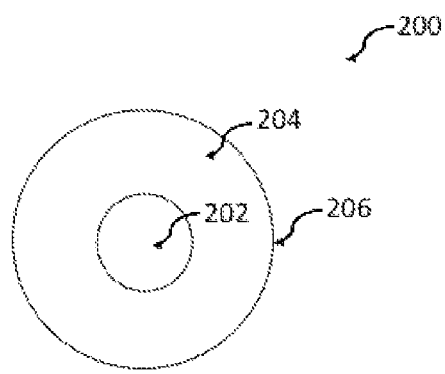
Figure 4:
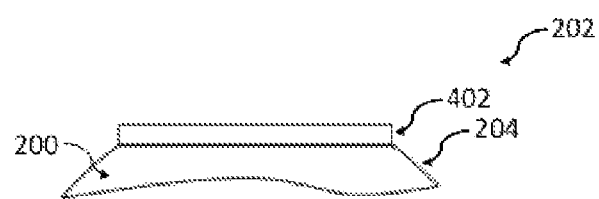
Figure 5:
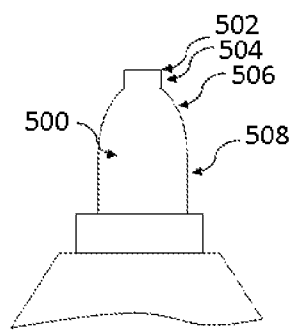
Figure 6:
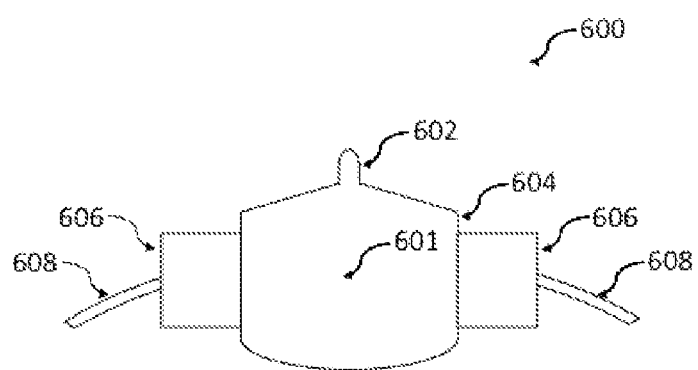
Figure 7:
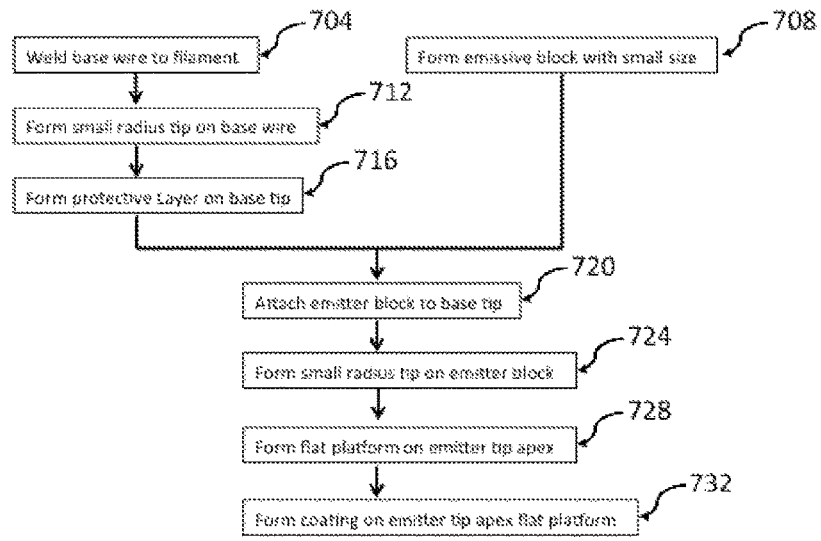
Figure 8:
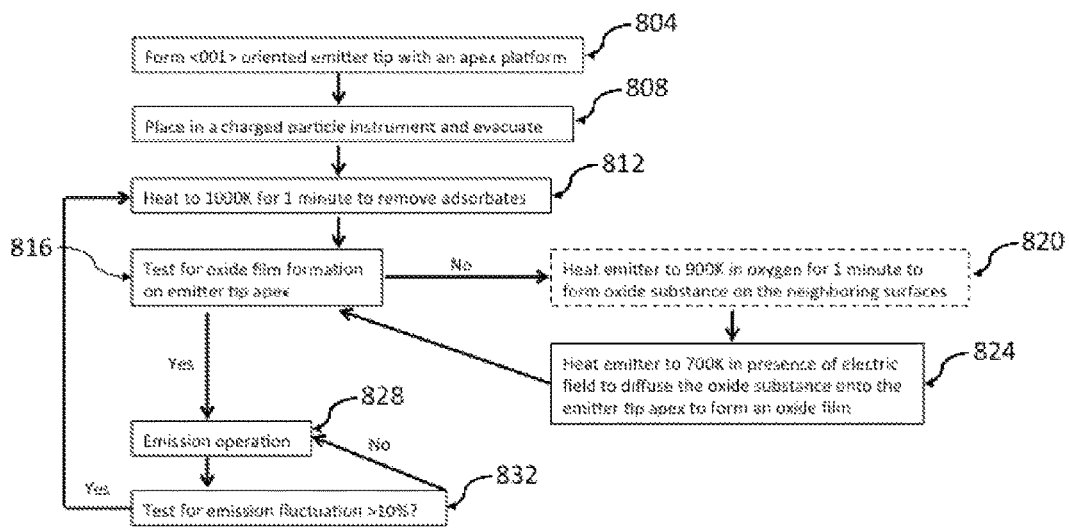
Figure 9:
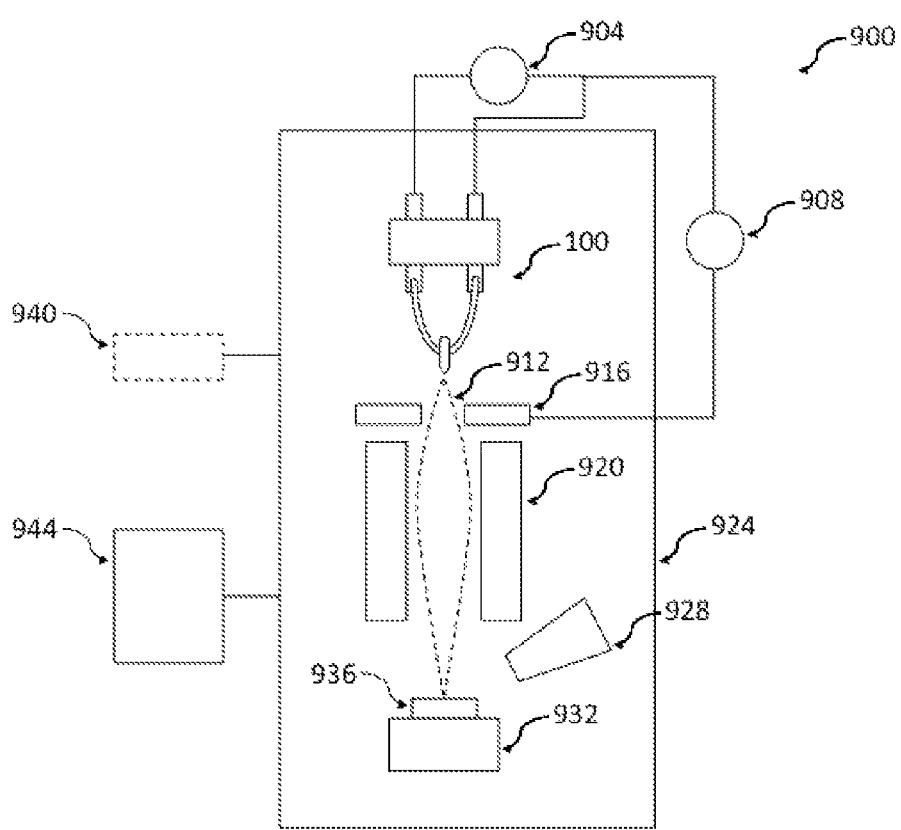

The following paragraphs will further describe the invention with the help of figures and detailed embodiments:

FIG. 1: Vacuum field electron emitter structure and components in embodiment 1;

FIG. 2: Magnified view of the base needle tip in FIG. 1;

FIG. 3: Top view of FIG. 2;

FIG. 4: Magnified view of the top flat platform in FIG. 2;

FIG. 5: Magnified view of the vacuum field electron emitter base needle tip in embodiment 2;

FIG. 6: Vacuum field electron emitter structure and components in embodiment 3;

FIG. 7: Flow chart showing the procedures of producing the vacuum field electron emitter described in this invention;

FIG. 8: Flow chart showing the procedures of forming the oxide film layer for the vacuum field electron emitter described in this invention;

FIG. 9: The structure and components of an electron beam instrument that uses the vacuum field electron emitter described in this invention.

DETAILED DESCRIPTION OF PREFERRED EMBODIMENTS

It is described in this invention that by using metal borides, carbides or nitrides as substrate, the oxide emissive layer can be stably bound to the substrate material, therefore is able to emit electrons at high current density with unchanged current density for long period of time. The reason for the better bonding strength with the oxide layer for the compound substrate than for the refractory metal substrate used in prior art is not completely clear, but is at least in part due to the fact that both the oxide layer and compound substrate are composed of covalent bonds and therefore should have better compatibility. A second reason could be that when the oxide layer and the substrate share the same metal component, the size of the lattice should be similar, therefore reduces interface mismatch. Additionally, under this condition, the oxide emissive layer can be directly formed by reacting the substrate with oxygen. This puts ease on electron gun manufacturing and operation.

The metal components in the low work function oxides are usually with low melting point and high reactivity. Therefore, it is difficult to use the single element forms of these metals to make the underneath substrate, the evaporation source or diffusion reservoir. The corresponding borides, carbides or nitrides of these metals are with high melting point, high mechanical strength and less reactive, which can be readily used as the proper substrate material. This makes ease of the use of any low work function oxide as emissive layer in any application where one particular oxide is preferred. The low work function and chemical stable nature of the proposed oxide film on compound substrate structure is generally desirable for cathode material. It should be further stated that the material can also be used in applications other than needle-shaped vacuum electron source. For example, the invention can also be used as the electron injection electrodes for organic or inorganic light emitting diode, cathode for organic or inorganic solar cell, organic or inorganic semiconductor transistor and electrochemistry cell, where plane or block shaped electrode is used.

What follows gives detailed description and examples of this present invention. It should be noted to the skilled in the art that the examples given below can be readily modified to create other film/substrate combination systems. However, it should be considered as obvious extensions that do not depart from the spirit of the present invention.

The present invention will be better understood by those skilled in the art by referencing to the drawings and schematics provided as follows.

Embodiment 1

The vacuum field electron emitter structure 100 is shown in FIG. 1. The field emitter is composed of the base needle 104 welded on the filament 106. The filament 106 is welded at its two ends with two metal posts 108, which are mechanically held together and electrically insulated by an insulator block 110. The base needle 104 is formed with a tip 102 of small radius of curvature, which is preferred to be less than 10 micron meters and more than 100 nanometers. The filament 106 structure is used to heat the base needle 104 by passing through a current to induce joule heating. The base needle 104 is made of high melting point conductive material, which includes but not restricted to C, W, Re, Ta, and Mo. The base needle 104 material should have a high melting point that is higher than the cleaning temperature and operation temperature used to process the field emitter. In one embodiment, the cleaning temperature and operation temperature is preferred to be up to 1300K. The base needle 104 could be either single crystalline or polycrystalline, with any tip 102 orientation direction with respect to the crystal structure.

FIG. 2 shows the magnified side view of the base needle 104 and needle tip 102. The base needle 104 is truncated into a flat platform. Two additional parts are constructed on top of the flat platform: the emissive block 200 and the binder layer 208. The emissive block 200 is preferred to include at least the following three parts: a top flat platform 202, a tapering region 204 and a cylindrical region 206. At least the top flat platform 202 is covered with oxide coating to emit electrons. The radius of the top flat platform 202 is preferred to be less than 500 nanometers, and more preferably less than 100 nanometers, and more preferably less than 10 nanometers. In some embodiment, the top flat platform 202 is composed of a few atoms or even only one single atom. The radius of the cylindrical region 206 should be larger or equal to that of the platform 202. The cylindrical region 206 can be shaped into a new flat platform 202 and a new tapering region 204 in case the original flat platform and the tapering region need to be removed during emitter regeneration. The length of the cylindrical region 206 should not exceed a critical length above which vibration becomes severe to influence emission pattern stability. It is easily understood by those skilled in the art that the critical length varies with radius and material of the emissive block 200. The three parts composing the emissive block 200 is shown with FIG. 3, which is a top view for FIG. 2, to assist visualization of the structure.

The emissive block 200 is preferred to be made of conductive borides, carbides or nitrides of the elements which include: the group 2 elements including Ca, Sr and Ba; from the group 3 elements including Sc, Y, and lanthanides; from the group 4 elements including Zr, Hf, and Th. For example, the emissive block 200 is made of hexaborides of Ca, Sr, Ba, Y, La, Ce, or monocarbides of Ti, Zr, Hf, Ta, Th. The emissive block 200 is preferred to be single crystalline with an axial orientation, perpendicular to which the crystal plane selectively bonds with the preferred oxide coating. In some embodiments, it is preferred to be <100>, <110> and <111>. Polycrystalline emissive block with a single tip top crystalline grain is obviously considered as to serve the same purpose.

The binder layer 208 should be conductive and have a radius larger or equal to that of the emissive block 200. The material for the binder layer 208 is preferred to be those, which do not react with either the emissive block 200 or the base needle 104 up to the temperature used to clean and operate the field emitter. In case there is a slow reaction between the binder layer 208 and the bound parts, the thickness of the binder layer 208 should be larger than that consumes during the entire lifetime of the field emitter. In some embodiments, the binder layer 208 can be made of C, W or Pt. The binder layer 208 can be formed, for example, by area selective deposition or reduced from paste, which contains the desired component. With injection of precursor gas, electron beam induced deposition or ion induced deposition can be used to deposit the binder layer 208 while the emissive block 200 and the base needle 104 are held close to each other by using mechanical manipulators. Epoxy droplet can also be applied to bind the emissive block 200 to the base needle 104. The epoxy droplet is then transformed into a C binder layer by thermal carburization in vacuum.

FIG. 4 is a magnified view of the emissive block top platform 202 for emissive block 200. An oxide layer 402 is coated on the platform 202 to serve as the electron emissive layer. The oxide material should contain: the group 2 elements including Ca, Sr and Ba; from the group 3 elements including Sc, Y, and lanthanides; from the group 4 elements including Zr, Hf, and Th. The oxide layer 402 is preferred to share the same metal component as the emissive block 200, because it results in small interface mismatch and makes it possible to directly form the oxide by reacting the emissive block 200 with oxygen. The oxide layer 402 can also be composed of different metal component from the emissive block 200, when the oxide forms small interface mismatch and therefore bonds strongly with the underneath emissive block 200, despite of their elementary difference. For example, La and Ce are similar in size and chemical properties. Therefore, it is obvious that one can coat CeO.sub.x. (with x unknown) on LaB.sub.6. or LaO.sub.x. (with x unknown) on CeB.sub.6. It is also obvious that one can use a mixed oxide such as La.sub.x.Ce.sub.y.O on a mixed compound substrate such as $La_z Ce_{(1-z)} B_6$. As long as the mixture combination gives good interface adherence, any combination is useable. It should be perceivable by those skilled in the art that even though the oxide layer 402 and the emissive block 200 share the same metal element, the interface mismatch might be larger than when they are different in the composing metal element. This is because of the additional size difference introduced by the size difference between O and B, when for example, boride is used as the emissive block 200 material. In those occasions, it might be more preferred to use the oxide metal element other than the same element as in the emission block 200, when the best adherence strength is desired more than the convenience in oxide layer 402 formation. It is preferred that the emissive block platform 202 is completely covered with an oxide layer 402 of at least one monolayer thickness. The thickness of the oxide layer 402 should be less than a critical thickness above which the structural stability is worsened or the resistivity of the oxide layer 402 is large enough to influence electron emission property.

Embodiment 2

Another preferred embodiment of the vacuum field electron emitter is slightly different from that described in embodiment 1. The difference is about the emissive block structure. As shown in FIG. 5, in this embodiment, the emissive block 500 is composed of at least 4 parts: the top flat platform 502, the top cylinder 504, the tapering region 506 and the cylindrical region 508. The parts other than the top cylinder 504 should be of the same structure and function as the needle tip 102 in embodiment 1. The top cylinder 504 is used to reduce electric field strength on the tapering region 506 and localize high electric field to the flat platform 502. The resultant distribution of electric field favors the localization of electron emission to the platform 502 and reduces structural build-up on the platform 502 of substance from the tapering region 506. This structure further improves emission stability of the field emitter. The raised flat platform structure described here can be made based on the principle that etching speed varies for crystal planes of different orientation for a compound emitter. For example, (100) crystal plane of the metal hexaboride structure has a slower etching rate than other planes when oxygen-containing gas is used as an etchant. A method forming the raised platform structure includes the steps of first, crystal planes of (100) are made on the emitter tip cap surface in a vacuum chamber; second, a positive potential is applied on the emitter with respect to a neighboring electrode while an oxygen-containing gas is allowed into the vacuum. When the emitter is terminated with the top platform 502 as (100) plane, the top platform 502 will have the slowest etching rate. The higher material removal on the surrounding crystal planes other than (100) results in the top cylinder 504. Field assisted hydrogen etching, field evaporation in vacuum, and thermal annealing for example, can be used to fabricate (100) planes on a hexaboride tip cap in the first step. In the second step, a higher applied voltage, stronger etchant type, higher etchant gas pressure, higher temperature and longer duration of time all result in a faster removal of material from the surrounding region. In one embodiment of the second step, the applicant has fabricated the above described raised flat platform 502 using an applied voltage from 2000V to 8000V and an etchant gas pressure from 1E-8 torr to 1E-5 torr with the etchant being either oxygen or water, under room temperature. It is therefore of ordinary skill for those skilled in the field to use different combination of voltage, etchant type, pressure, temperature and operation time to form the herein described top cylinder 504.

Embodiment 3

This embodiment provides another form of vacuum field electron emitter structure. It includes insulator block, two metal posts set through the above described insulator block, and filament welded between the two metal posts. As shown in FIG. 6, the vacuum field electron emitter 600 includes emissive block 601. The emissive block 601 is divided into two parts: an emissive tip 602 and a base 604. The heating filament 608 is divided into two parts in the middle position and each end is welded with a heater pad 606. The heater pads 606 serve two functions: one is to mechanically hold the emissive block 601; another function is to generate heat when a current is passing through. The heater pad 606 is preferred made of graphite. In this embodiment, the emissive block 601 is preferred made of conductive borides, carbides or nitrides of the elements which include: the group 2 elements including Ca, Sr and Ba; from the group 3 elements including Sc, Y, and lanthanides; from the group 4 elements including Zr, Hf, and Th. For example, the emissive block 601 is made of hexaborides of Ca, Sr, Ba, Y, La, Ce, or monocarbides of Ti, Zr, Hf, Ta, Th. The emissive block 601 is preferred to be single crystalline with an axial orientation, perpendicular to which the crystal plane selectively bonds with the preferred oxide coating. In some embodiments, it is preferred to be <100>, <110> and <111>. Polycrystalline emissive block with a tip top single crystalline grain can also be used for the same purpose. The tip top structure of the emissive tip 602 is preferred to follow the same principle as described in FIG. 2 and FIG. 5. The emissive tip 602 can be fabricated by micro-scale machining. For example, a single crystal can be first cut into the shape of the base 604 without the emissive tip 602. In a following step, focused ion beam (FIB) milling is applied to remove surrounding material till an emissive tip 602 is formed.

Embodiment 4

The preferred combination of material and geometry of the emissive block, material and dimension of the oxide layer can result in difference in application of the made vacuum electron emitter product. This embodiment provides several performance examples where the vacuum field electron emitters of the invention are applied in order to clarify the fact that the invention is capable of realizing longer stable operation time under higher gas pressure compared to prior art.

In one example, the applicant has tested one emitter with an extraction voltage of less than 800 v, with an emission current less than 3 micron ampere, with a heating temperature less than 1000K, with a current fluctuation less than 5%, with a stable period longer than 100 hours, under a vacuum not better than 3E-9 torr;

In another example, the applicant has tested one emitter with an extraction voltage of less than 500 v, with an emission current less than 1 micron ampere, with a heating temperature less than 800K, with a current fluctuation less than 5%, with a stable period longer than 30 hours, under a vacuum not better than 2E-10 torr;

In another example, the applicant has tested one emitter with an extraction voltage of less than 1000 v, with an emission current less than 10 micron ampere, with a heating temperature less than 1100K, with a current fluctuation less than 5%, with a stable period longer than 60 hours, under a vacuum not better than 3E-9 torr;

In another example, the applicant has tested one emitter with an extraction voltage of less than 700 v, with an emission current less than 5 micron ampere, with a heating temperature less than 700K, with a current fluctuation less than 10%, and with a stable period longer than 40 hours, under a vaccum not better than 1E-10 torr.

The operation parameters given above should be taken as only examples, but not limitations of the current invention.

Embodiment 5

This embodiment provides a method and its flow chart to produce the vacuum field electron emitter of the invention. As shown in FIG. 7, in the step 704, a base wire is welded at the middle portion of a filament structure. The two ends of the filament are welded to the two posts embedded in an insulator block, as described in FIG. 1. In the step 712, the top part of the base wire is immersed into an etchant solution while an electric potential is applied onto the wire with respect to a Pt loop placed nearby. The etchant type, concentration and electric potential type vary with different base wire material used. The base wire is etched into a base needle by the electrochemical etching process. A tip radius of curvature typically under 10 micron meters can easily be made by people with ordinary skills. It is preferred, yet not required to have the base needle tip terminated with a flat platform. This flat platform can be made by micro-machining techniques, for example, focused ion beam milling. In the step 716, a protective layer is coated onto the base needle tip so that the tip material is prevented from reacting with the emissive block that is to be attached onto the base needle tip. In one example, the protective layer is made of C. Various film deposition techniques can be applied to coat the base needle with such protective layer, such as chemical vapor deposition, thermal reduction from epoxy or charged particle beam induced deposition. In the parallel step 708, an emissive block is made. Procedures, for example, can include: take a single crystal of the desired emission block material; and machine the single crystal to a block with 3 dimensions defined by width, thickness and height using focused ion beam milling if the starting single crystal does not meet the dimension requirement. The desired width of the block is anywhere between 10 nano meters and 10 micron meters. The desired thickness of the block is anywhere between 10 nano meters and 10 micron meters. And the desired height of the block is anywhere between 500 nano meters and 50 micron meters. In the step 720, the emissive block is placed close to the base needle tip with the protective layer separating the two. The height of the emissive block is aligned with the base needle axis. The precise alignment can be done, for example, by using electrically driven mechanical manipulator. A binder layer is then applied at the joint of the emissive block and base needle tip to fix the structure mechanically and also to provide electric conductance. When the binder layer is sufficiently thick and the emissive block is not in direct contact with the base needle material, the protective layer as described in step 716 can be omitted. In the step 724, the emissive block is machined into a tip with small radius of curvature. The preferred radius of curvature is anywhere between 5 nano meters and 200 nano meters. If the emissive block directly made from step 708 does not meet the size requirement, one can use focused ion beam milling to reduce the tip radius of curvature to the desired size. In the step 728, a flat platform is made on the top of the emissive block tip, as described in FIG. 2 and FIG. 5. The platform is preferred to be of an area less than 400 nano meter squared. Techniques that one can use to make this platform include: focused ion beam milling, field assisted etching with etchant gas of hydrogen, nitrogen or oxygen, field evaporation in vacuum or inert gas, and thermal annealing. The emissive block is preferred to be oriented along the crystal direction perpendicular to which dense packed atomic planes are formed, such as <100>, <110> and <111> directions. Surface faceting due to field etching, field evaporation or thermal annealing forms dense packed planes that can be used as the flat platform at the tip top. In the step 732, oxide emissive layer is formed onto the tip flat platform on the emissive block. Various coating techniques can be used to form this oxide. In one example with $MO_x$, with M denoting the desired metal element and x denoting an unknown stoichiometry, an evaporator is used to provide vapor that contains M element through heating a source material containing M to an evaporation temperature. Oxygen can be included in the source material, or can be introduced as separate oxygen gas. The oxygen gas can either be introduced during the M vapor deposition to form $MO_x$. Or the M deposition layer can be converted to $MO_x$ layer by a following oxidation process. Surface diffusion of $MO_x$ onto the tip platform from other part on the field emitter can also be used to make the oxide coating. Detailed description of this technique is in FIG. 8.

Embodiment 6

FIG. 8 is a flow chart showing one example of the procedures used to form the oxide emissive layer and operate it in a charged particle instrument. In the step 804, a field emitter, such as the one that is described in FIG. 2 or FIG. 5, is made and a flat platform is made on its emissive tip apex. The emissive block in this example is preferred to be $MB_6$, the hexaboride of element M, which is preferred to be among Ca, Sr, Ba, Y, La, or Ce. The $MB_6$ emissive block is oriented along the crystal <100> direction. The flat platform at the tip apex is, in this case, (100) lattice plane of the corresponding hexaboride. In the step 808, the field emitter is installed in a charged particle instrument as the electron emitter and it is followed by evacuation of the instrument chamber. A preferred operating vacuum for the field emitter of this invention should be better than 1E-7 torr. In the step 812, the emissive block on the field emitter is heated to a cleaning temperature, which is high enough to desorb the evaporative substance adsorbed on the field emitter surface. The evaporative substance is presumably water and organic molecules. In one embodiment, the cleaning temperature is not higher than 1000K. The cleaning temperature should not exceed that above which oxide of the component metal starts to evaporate. In one embodiment, the cleaning temperature is not higher than 1300K, or more preferably, not higher than 1200K. Because the oxides of different desired element are with different evaporation point, it is obvious that the cleaning temperature should be with different limit when applying to different emissive block materials. The heat-cleaning time also can vary depending on the amount of adsorbates on the field emitter and the cleaning temperature it uses. In one embodiment, time duration not longer than 1 minute is used. In the step 816, whether the desired oxide coating has been formed on the emissive tip platform is tested. One result of the oxide coating formation is lowering of the platform work function. Therefore, any method capable of determining the work function value or work function change can be applied to carry out the test. For example, one can record emission current change with respect to different extraction voltages to form an I-V curve. From the I-V curve, one can make a so-called fowler-nordheim plot. After that, the slope of the plot can be used to determine work function of the emitter. In one embodiment, one can measure the work function before oxide coating treatment is performed and use this value to compare with those obtained after certain coating treatment is performed. Another method of testing utilizes the fact that field emission current increases dramatically with the lowering of work function of the emitter. In this method, one can record the emission current value with respect to a fixed extraction voltage before any coating treatment is performed. After certain treatment, one can measure the emission current again using the same extraction voltage. When one repeatedly obtains a relatively stable emission current value after a certain coating treatment, and that value is higher than the untreated emission current, one can conclude that an oxide layer has been formed. Another method utilizes the fact that the selective coating of the oxide layer on the emitter apex platform results in the lowering of work function on the apex platform only, therefore results in a collimated field emission pattern with a divergence angle not higher than 30 degree. One can record the field emission pattern using an imaging device, such as a phosphor screen. When one repeatedly obtains a relatively stable field emission pattern with small divergence angle, one can conclude that an oxide layer has been formed. If the oxide coating is not formed on the apex platform, one moves to the step 820. In the step 820, oxygen containing gas is introduced to oxidize the $MB_6$ emissive block so that $MO_x$ (with x unknown) substance is formed on the surface of the emissive block. The emissive block is heated to a reaction temperature either after the oxygen exposure or during the oxygen exposure to ensure reaction between M and O. The reaction temperature should be lower than the evaporation point of the desired oxide, $MO_x$ (with x unknown) under the reaction oxygen containing gas pressure. The reaction time should be sufficient for the oxide substance formation. In general, the higher oxygen exposure pressure, the lower reaction temperature and shorter reaction time are required. In one embodiment, oxygen gas pressure between 1E-7 torr and 1 atmospheric pressure, reaction temperature between 600K and 1400K, and reaction time between 10 seconds to 5 minutes are used. It should be easily perceived by those skilled in the art that other combinations of oxygen containing gas type, gas pressure, reaction temperature and reaction time should all be considered within the scope of this invention. In some occasions, the oxide substance has already formed on the emissive block surface during synthesis or processing before being installed into the vacuum chamber. In these occasions, step 820 becomes optional and not a must. In the step 824, a diffusion process is carried out to form the oxide coating selectively onto the apex platform. It is discovered that surface oxide substance can diffuse onto the (100) plane of $MB_6$, in this case, the apex platform, under electric field. In one preferred embodiment, the voltage applied on the emissive block is of negative bias with respect to a neighboring electrode and with a magnitude corresponding to an emission current between 10 nano ampere and 10 micron ampere. It is also discovered that a mild temperature heating with the applied voltage can facilitate this diffusion process so that it takes shorter time to reach full coverage of the (100) plane. In one preferred embodiment, a heating temperature between 600K and 1000K is used. Another discovery is that after the initialization of oxide diffusion by electric field, the full coverage of oxide on (100) plane can be reached by exposing the emitter to oxygen containing gas for an aging process with or without heating while the applied voltage is switched off. In one example, the oxygen pressure is between 1E-8 torr and 1E-9 torr and the aging time is between 20 hours and 60 hours. After one of or the combination of the described treatments, one moves to the step 816 to test the oxide formation. Step 816, step 820 and step 824 should be circulated till the oxide coating completion is confirmed. In some occasions, such as when a phosphor screen is used to image the field emission pattern, step 816 can be performed together with step 824. If the oxide film formation is confirmed, one moves to the next step 828. In this step 828, extraction voltage is applied to the field emitter to achieve a desired field emission current. It is preferred that the field emitter is operated under temperature not higher than 400K, because low temperature operation results in the narrowest energy spread. On the other hand, a higher operation temperature allows the operation of the inventive field emitter under a higher residue gas pressure stably for a longer period of time. An operation temperature should not exceed the evaporation point of the desired oxide, $MO_x$ (with x unknown) under the residue gas pressure. In one embodiment, it should not exceed 1300K. In the step 832, one should check the emission fluctuation for the field emitter. This can be carried out simultaneously with the step 828 when the field emission current is monitored by an electrometer. During operation, contaminants or excessive oxide substance can form on the desired oxide coating surface, which causes emission current fluctuation. Here, the emission current fluctuation is defined as the change of emission current over emission current average value in a period of one minute. In one embodiment, a critical value of 10% in emission fluctuation is used. When the emission current fluctuation exceeds the critical value, one should move to step 812, where the emitter is heated to a cleaning temperature to restore the stable emission characteristics. By circulating through step 812 to step 832, one can obtain a stable electron emission practical for a charged particle instrument application.

Embodiment 7

This embodiment shows one embodiment of the field emitter used in a charged particle instrument. As shown in FIG. 9, in this embodiment, the charged particle instrument is a field emission scanning electron microscope (SEM) 900. The field emitter 100, as described in FIG. 1, is installed in the SEM vacuum chamber 924 with its two filament current posts connected to the out side of the chamber. A filament power supply 904 is used to supply the heating current to the filament. An extractor electrode 916 is placed close to the field emitter tip 100 to supply electric field that is used to free electrons from the emissive block. The extractor electrode 916 is connected to the out side of the chamber 924 through vacuum feedthrough. An extraction voltage power supply 908 is used to keep an extraction potential difference between the field emitter 100 and the extractor electrode 916. An electron beam 912 is generated from the field emitter 100 by applying an extraction potential. A scanning and focusing system 920 is used to focus the electron beam 912 into a small electron probe and scan the probe on the specimen surface 936. A specimen 936 is mounted on a moving stage 932, which is used to facilitate observing the specimen. A signal detector 928 is placed near the specimen 936 to collect signals generated by the interaction between the electron probe and the specimen. A vacuum pump 944 is used to create the desired vacuum in the chamber 924. An oxygen source 940 is used to introduce oxygen containing gas with a desired pressure. The oxygen gas can also be introduced from surroundings by reducing the pumping power of the vacuum pump 944 or leakage to the out side of the chamber 924. Therefore, the oxygen source 940 is optional, and not required in this embodiment.

The parameters and steps described in detail above should be taken as examples to facilitate the understanding of the current invention, rather than the limitation of the disclosure. Any modification of the structure, composition, procedures, parameters of operation should be taken as obviously expectable from the spirit of this invention, which is defined in the following claims:

The invention claimed is:

1. An electrode material with both low work function and high chemical stability, which is composed of a conductive single crystalline compound substrate as an emissive block and an oxide film formed on the surface of the emissive block as an emissive layer, the conductive single crystalline compound is boride, carbide or nitride of elements selected individually from or a combination of Ca, Sr, Ba, Sc, Y, Lanthanides, Th, Ti, Zr, and Hf.

2. An electrode material according to claim 1 wherein the metal boride is a single crystalline hexaboride of Ca, Sr, Ba, Sc, Y, and lanthanides, oriented in the lattice direction of <100>, <110>, or <111>.

3. An electrode material according to claim 1 wherein the oxide film is metal oxide composed of, aside from oxygen, elements selected individually from or are a combination of Ca, Sr, Ba, Sc, Y, Lanthanides, Th, Ti, Zr, and Hf.

4. An electrode material according to claim 2 wherein the emissive block is in the form of a needle and the apex of the needle is coated with the oxide film.

5. An electrode material according to claim 4 wherein the apex of the emissive block needle is a top flat platform perpendicular to the needle axis and the oxide film covers at least the top flat platform.

6. An electrode material according to claim 5 wherein the emissive block needle apex is in the form of a top cylinder which axis is parallel or overlapping with the emissive block axis and the top flat platform perpendicular to the needle axis is the top surface of the top cylinder.

7. A vacuum electron field emitter structure which is composed of: an insulator block; two electrode posts running through the insulator block; a filament welded onto the ends of the two electrode posts; a base needle welded in the middle portion of the filament and the base needle forms a tip at its apex; an emissive block attached onto the base needle tip, but still separated from the base needle with a binder layer and the emissive block is with a cylindrical region, a tapering region formed by contracting the top edge of the cylindrical region towards emissive block axis, a top flat platform perpendicular to the emissive block axis formed on the apex of the tapering region and the emissive block is a single crystalline hexaboride substrate; an electron emissive layer which is formed on the emissive block apex top flat platform and the emissive layer is oxide film.

8. A vacuum electron field emitter structure according to claim 7 wherein the emissive block material is single crystalline hexaboride of elements selected individually from or are a combination of Ca, Sr, Ba, Sc, Y, Lanthanides, Th, Ti, Zr, and Hf.

9. A vacuum electron field emitter structure according to claim 7 wherein the oxide film is metal oxide composed of metal elements selected individually from or a combination of Ca, Sr, Ba, Sc, Y, Lanthanides, Th, Ti, Zr, and Hf.

10. A vacuum electron field emitter structure according to claim 7 wherein the base needle is made of conductive material with high melting point and the conductive high melting point material is selected from C, W, Re, Ta or Mo.

11. A vacuum electron field emitter structure according to claim 7 wherein the binder layer is composed of C, Pt or W.

12. A vacuum electron field emitter structure according to claim 7 wherein the emissive block tapering region has a top cylinder on it and the axis of the top cylinder is parallel or overlapping with the emissive block axis and the top surface of the top cylinder is the flat platform perpendicular to the emissive block.

13. A method for producing an electrode material which is composed of an emissive block of conductive compound substrate and an emissive layer of oxide film formed on the surface of the emissive block; when the compound substrate is single crystalline metal hexaboride, the emissive block is in the form of needle or cylinder, and a top cylinder is formed on top of emissive block with the axes of two parts parallel or overlapping, the method for producing an electrode material includes procedures for producing the top cylinder and the procedure for producing the top cylinder is as follows:
  a. in vacuum, form a hemispherical tip cap of the emissive block with the hemisphere apex as (100) lattice plane;
  b. apply a positive bias to the emissive block with respect to a neighboring electrode under a gas pressure of etchant gas;
  c. during the hemisphere surface being etched by the etchant gas, the etching rate of the apical (100) lattice plane is slower than that of other lattice planes; when a top cylinder is formed perpendicular to the emissive block axis on the hemisphere surface because of the etching rate difference, stop the applied electric bias and remove the etchant gas and the top cylinder is formed.

14. A method according to claim 13 wherein said etchant gas is oxygen, nitrogen or water.

15. A method for producing an electrode material which is composed of an emissive block of conductive compound substrate and an emissive layer of oxide film formed on the surface of the emissive block; when the compound substrate is single crystalline hexaboride, the emissive block is in the form of needle or cylinder, and a top flat platform perpendicular to the emissive block axis formed on the apex of the emissive block, the method for producing an electrode material includes forming oxide film onto the emissive block flat platform and a procedure is as follows:
  a. forming oxide substance on the neighboring surface of the top flat platform;
  b. applying an electric potential on the emitter with respect to a neighboring electrode to diffuse the oxide substance onto the flat platform in vacuum;
  c. stopping the applied potential when the oxide film completely covers the top flat platform and the formation of oxide film on top of emissive block flat platform is completed.

16. A method according to claim 15 wherein the step a is by heating the emissive block in an oxygen-containing gas.

17. A method according to claim 15 wherein the step a is by depositing oxide substance onto top flat platform neighboring surface in ways of thin film deposition techniques.

18. A method according to claim 15 wherein the step b is accompanied by heating to a temperature at which the mobility of the oxide substance increases and the heating is stopped when step b is completed.

19. A method according to claim 15 wherein the procedures include step d after the completion of step c: heating the emissive block to a temperature lower than the oxide film vaporization point to realize strong bonding between the oxide film and the flat platform.

20. A method according to claim 15 wherein the procedures include step d after the completion of step c: keeping the emissive block in a certain oxygen-containing gas pressure for a certain time to achieve strong bonding between the oxide film and the flat platform, with or without heating.

\* \* \* \* \*